(12) United States Patent
Choi

(10) Patent No.: US 10,707,278 B2
(45) Date of Patent: Jul. 7, 2020

(54) BACKPLANE SUBSTRATE AND FLEXIBLE DISPLAY USING THE SAME

(71) Applicant: LG Display Co., Ltd., Seoul (KR)

(72) Inventor: Won-Jin Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 63 days.

(21) Appl. No.: 15/799,775

(22) Filed: Oct. 31, 2017

(65) Prior Publication Data

US 2018/0122871 A1 May 3, 2018

(30) Foreign Application Priority Data

Oct. 31, 2016 (KR) .................. 10-2016-0143981

(51) Int. Cl.
*G06F 1/16* (2006.01)
*H01L 27/32* (2006.01)
*H01L 51/52* (2006.01)
*G06F 3/041* (2006.01)
*G06F 3/044* (2006.01)
*H01L 51/00* (2006.01)

(52) U.S. Cl.
CPC .......... *H01L 27/3223* (2013.01); *G06F 3/044* (2013.01); *G06F 3/0412* (2013.01); *H01L 51/0097* (2013.01); *H01L 51/5253* (2013.01); *G06F 2203/04102* (2013.01); *G06F 2203/04111* (2013.01); *G06F 2203/04112* (2013.01); *H01L 27/323* (2013.01); *H01L 27/3244* (2013.01); *H01L 2251/5338* (2013.01); *Y02E 10/549* (2013.01)

(58) Field of Classification Search
CPC ......... G06F 3/0412; G06F 2203/04102; G06F 1/1652; H01L 51/0097; H01L 51/5253; H01L 27/322; H01L 2251/5358; G09G 2380/02
See application file for complete search history.

(56) References Cited

U.S. PATENT DOCUMENTS

2017/0262109 A1* 9/2017 Choi .................. G06F 3/0412
2017/0278901 A1* 9/2017 Kim ................... H01L 51/0097
2018/0083211 A1* 3/2018 Lee .................... H01L 27/3258

FOREIGN PATENT DOCUMENTS

| CN | 103187428 A | 7/2013 |
| CN | 104425550 A | 3/2015 |
| CN | 205609531 U | 9/2016 |
| TW | 200838349 A | 9/2008 |

\* cited by examiner

*Primary Examiner* — Dennis P Joseph
(74) *Attorney, Agent, or Firm* — Seed IP Law Group LLP

(57) ABSTRACT

Disclosed are a backplane substrate, which achieves improved interface bonding characteristics via a recess configuration at the interface of an organic layer with an inorganic layer, thereby preventing peeling due to repeated folding, and a flexible display using the same. An organic layer is introduced into a recess provided in an inorganic layer so as to achieve improved interface bonding characteristics.

17 Claims, 11 Drawing Sheets

| Form inorganic buffer layer, active buffer layer and active layer on base substrate (110S) |
| --- |
| Form gate insulation layer and first wire (120S) |
| Form interlayer insulation stack and contact hole (130S) |
| Form second wire (140S) |
| Form protective layer and first pixel contact hole (150S) |
| Planarization layer and second pixel contact hole (160S) |
| Form first electrode (170S) |
| Form bank (180S) |

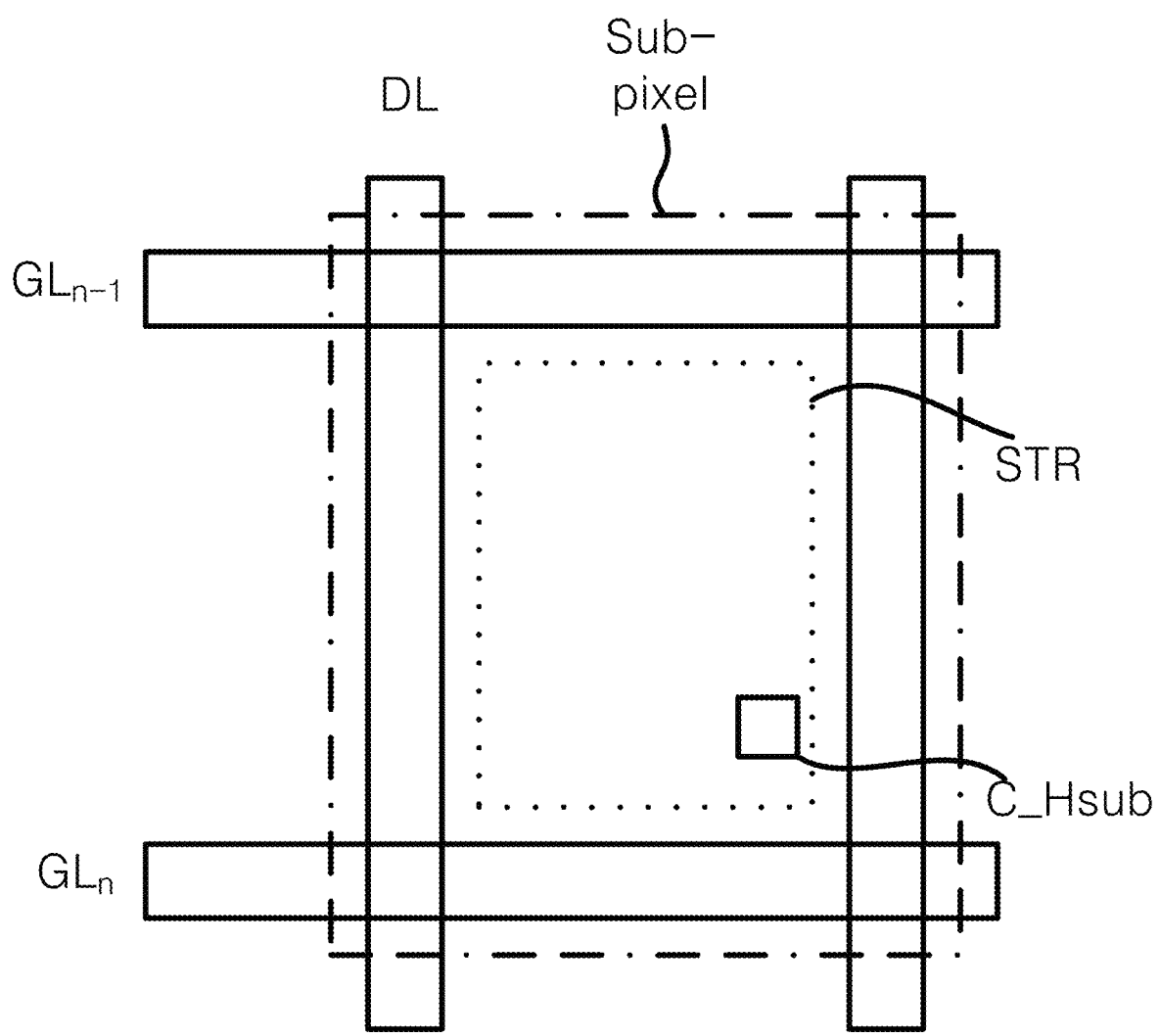

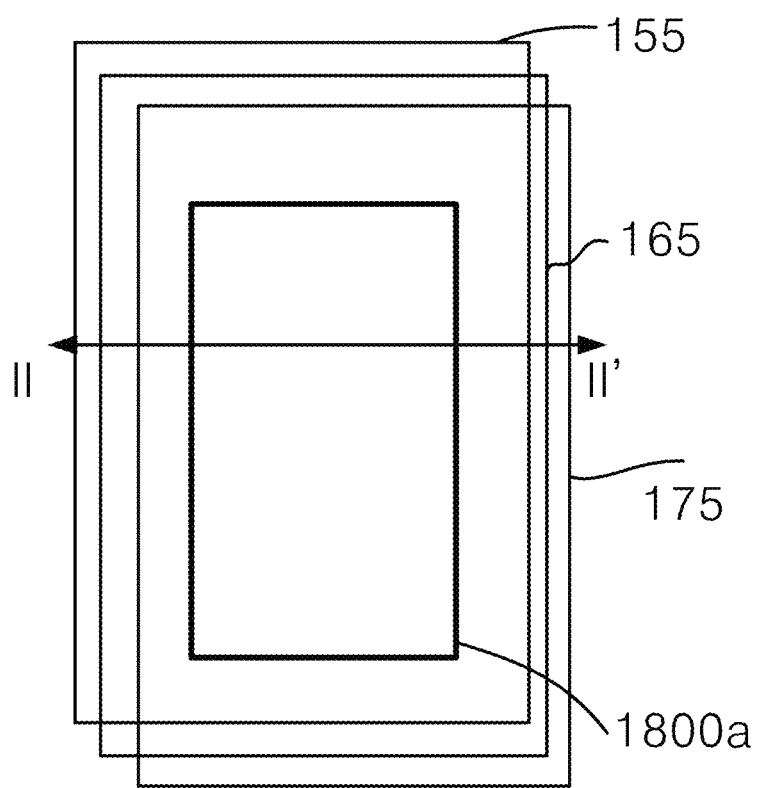

BACKPLANE SUBSTRATE AND FLEXIBLE DISPLAY USING THE SAME

CROSS-REFERENCE TO RELATED APPLICATION

This application claims priority to and the benefit of Korean Patent Application No. 10-2016-0143981, filed Oct. 31, 2016, which is hereby incorporated by reference as if fully set forth herein.

BACKGROUND

Technical Field

The present disclosure relates to a backplane substrate, and more particularly, to a backplane substrate, which achieves improved interface bonding characteristics via a recess configuration at the interface of an organic layer with an inorganic layer, thereby preventing peeling due to repeated folding, and a flexible display using the same.

Description of the Related Art

Concrete examples of a flat panel display device may include, for example, a liquid crystal display (LCD) device, an organic light-emitting display (OLED) device, a plasma display panel (PDP) device, a quantum dot display device, a field emission display (FED) device, and an electrophoretic display (EPD) device. These devices are alike in that they necessarily require a flat display panel that realizes an image. Such a flat display panel has a configuration in which a pair of transparent insulation substrates is bonded to face each other with an inherent luminous or polarizing material or some other optical material layer therebetween.

With the recent increase in the size of display devices, a demand for a planar display device that occupies a small volume of space is increasing. As this demand grows, recently, there is a demand for using the planar display device in a flexible form.

A flexible display is gradually thinning and developing to a foldable form. However, flexible displays to date have shown various problems, such as damage to a folding portion as a folding operation is repeated and the number of folding operations is increased. For example, high physical stress upon folding causes damage to pixels in a folding area, preventing the folding portion from being turned on at all. Even if turn-on failure due to repeated folding does not occur, the repeated folding causes variation in a capacitance value of each sub-pixel as time passes, which results in deterioration in image quality.

In addition, the flexible display undergoes peeling at the interface, which develops poor bonding characteristics as folding is repeated, and the prevention thereof is structurally difficult. In particular, once a portion begins to peel off, the entire interface may be separated due to folding, with the peel-off starting point as a seed, which is a major problem that deteriorates reliability.

BRIEF SUMMARY

Accordingly, the present disclosure is directed to a backplane substrate and a flexible display using the same that substantially obviate one or more problems due to limitations and disadvantages of the related art.

An object of the present disclosure is to provide backplane substrate, which achieves improved interface bonding characteristics via a recess configuration at the interface of an organic layer with an inorganic layer, thereby preventing peeling due to repeated folding, and a flexible display using the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

The present disclosure relates to a backplane substrate and a display device using the same, in which an adhesion recess is provided in an inorganic layer stack under an organic layer so that the organic layer has a wide contact area with the inorganic layer stack through the adhesion recess, whereby peeling of the organic layer is prevented, and consequently, reliability with respect to repeated folding operations is improved.

To achieve these objects and other advantages and in accordance with the purpose of the disclosure, as embodied and broadly described herein, a backplane substrate includes a flexible base substrate in which an active area having a plurality of sub-pixels is defined in a center thereof and a dummy pixel portion having dummy pixels, which are provided respectively in the same line as the pixels, is defined along an edge of the active area, an organic layer configured to cover both the dummy pixels and the sub-pixels, and an inorganic layer stack configured to be in contact with the organic layer thereabove over at least the dummy pixels, the inorganic layer stack having a plurality of adhesion holes or recesses, into which the organic layer is introduced, namely, when the organic layer is formed, a portion of it is formed in the adhesion recess.

The adhesion recesses in the inorganic layer stack may have a greater diameter at a lower side thereof than at an upper side thereof. In addition, the organic layer may be in contact with a lateral side and a bottom of each adhesion recess.

In addition, the inorganic layer stack may include a first wire and a second wire located in different layers so as to overlap each other, and a first interlayer insulation layer located between the first and second wires.

The adhesion recess provided in the first wire may have a greater diameter than the adhesion recess provided in the second wire. In this case, the first wire may have a different etch selectivity than the second wire.

In addition, the backplane substrate may further include a third wire located on an upper side of the second wire so as to overlap the second wire, and a second interlayer insulation layer between the second wire and the third wire. In this case, the adhesion recess provided in the first wire may have a greater diameter than the adhesion recess provided in the second wire and the third wire. Here, the second wire and the third wire may have a different etch selectivity than the first wire.

The inorganic layer stack may further include a plurality of sub-adhesion recesses in the sub-pixels.

In accordance with another aspect of the present disclosure, a flexible display includes a first flexible base substrate in which an active area having a plurality of sub-pixels is defined in a center thereof and a dummy pixel portion having dummy pixels, which are provided respectively in the same line as the pixels, is defined along an edge of the active area, a second flexible base substrate configured to be opposite the first flexible base substrate and having a touch wire, an adhesive layer provided between the first and second flexible base substrates, an organic layer provided on at least one of the first flexible base substrate and the second flexible base substrate so as to correspond to the dummy pixels and the sub-pixels, and an inorganic layer stack configured to be in contact with the organic layer thereabove over at least the dummy pixels, the inorganic layer stack having a plurality of adhesion recesses, into which the organic layer is introduced.

In addition, the organic layer and the inorganic layer stack may be provided on the first flexible base substrate.

The organic layer and the inorganic layer stack may be additionally provided on the second flexible base substrate.

The adhesion recesses in the inorganic layer stack may have a greater diameter at a lower side thereof than at an upper side thereof.

The inorganic layer stack may include wires provided in two or more different layers, and an interlayer insulation layer provided between the wires.

Here, the organic layer may be in contact with a lateral side and a bottom of each adhesion recess.

The inorganic layer stack may further include a plurality of sub-adhesion recesses in the sub-pixels.

It is to be understood that both the foregoing general description and the following detailed description of the present disclosure are example and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 6 is a plan view illustrating a sub-pixel of the backplane substrate according to the present disclosure;

FIGS. 7A and 7B are plan views illustrating several embodiments of an adhesion recess in the dummy pixel of the backplane substrate according to the present disclosure;

DETAILED DESCRIPTION

Figure 1:
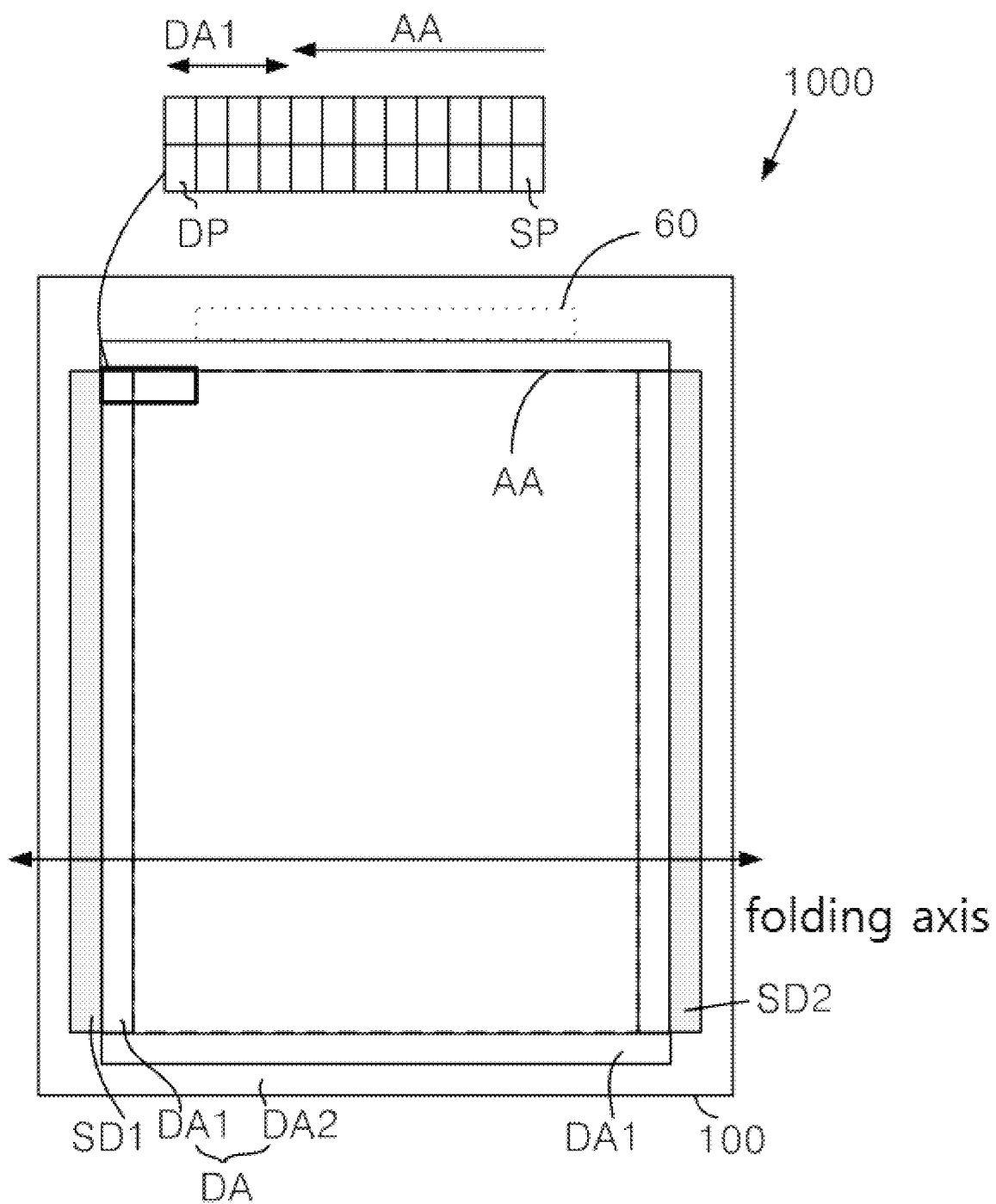
FIG. 1 is a plan view illustrating a backplane substrate according to the present disclosure.

The advantages and features of the present disclosure and the way of attaining them will become apparent with reference to embodiments described below in detail in conjunction with the accompanying drawings. The present disclosure, however, are not limited to the embodiments disclosed hereinafter and may be embodied in many different forms. Rather, these example embodiments are provided so that this disclosure will be through and complete and will fully convey the scope to those skilled in the art. The scope of the present disclosure should be defined by the claims.

In the drawings for explaining the example embodiments of the present disclosure, for example, the illustrated shape, size, ratio, angle, and number are given by way of example, and thus, are not limited to the specification or figures of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has," used in this specification, do not preclude the presence or addition of other elements unless it is used along with the term "only." The singular forms "a," "an," and "the" are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on," "above," "below," "aside," or the like, one or more other parts may be located between the two parts unless the term "directly" or "closely" is used.

In the description of the various embodiments of the present disclosure, when describing temporal relationships, for example, when the temporal relationship between two actions is described using "after," "subsequently," "next," "before," or the like, the actions may not occur in succession unless the term "directly" or "just" is used.

In the description of the various embodiments of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various embodiments of the present disclosure may be partially or wholly coupled to and combined with each other, and various technical linkage and driving thereof are possible. These various embodiments may be performed independently of each other, or may be performed in association with each other.

*Backplane Substrate*

A backplane substrate, which will be described below, is a configuration in which a thin-film transistor array and an organic light-emitting array are provided on a flexible base substrate. In some cases, the backplane substrate also refers to a configuration in which only a thin-film transistor array, excluding an organic light-emitting array, is included. Such a backplane substrate includes a plurality of sub-pixels, and enables gradation for respective sub-pixels.

In addition, the backplane substrate of the present disclosure has a structure that exhibits excellent folding reliability when applied to a flexible display, but is not limited in the application to the flexible display, and may be applied to any other flat panel display device. In this case, the base substrate used therein may be any one of a glass substrate and a plastic substrate.

Figure 2:
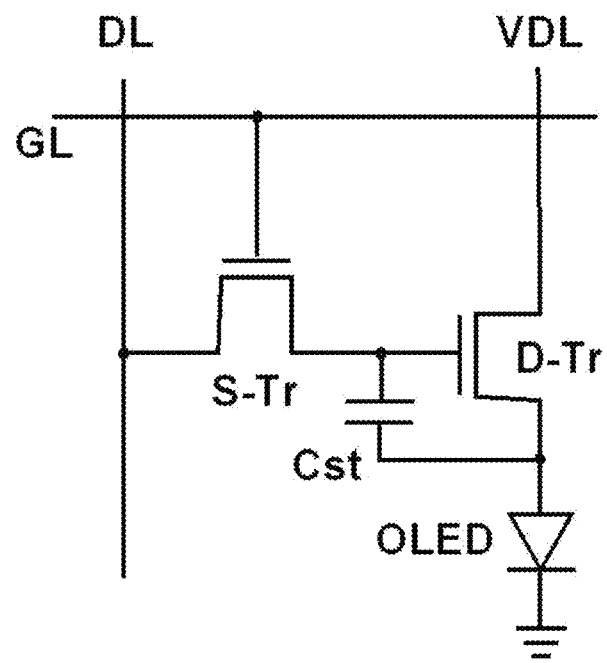
FIG. 2 is a circuit diagram of a sub-pixel illustrated in FIG. 1.

FIG. 1 is a plan view illustrating a backplane substrate according to the present disclosure, and FIG. 2 is a circuit diagram of a sub-pixel illustrated in FIG. 1.

As illustrated in FIG. 1, in the backplane substrate 1000 of the present disclosure, an active area AA having a plurality of sub-pixels SP is defined in the center thereof, and a dummy pixel portion DA1 having one or more dummy pixels DP provided in the same line as the pixels SP is defined along the edge of the active area AA. The dummy pixels DP may be provided in a number of ten or fewer at opposite sides or the upper and lower sides of the active area AA, in order to avoid deterioration in resolution.

The portion of the backplane substrate 1000 outside the active area AA is a non-display area DA. The non-display area DA includes the above-described dummy pixel portion DA1 and a dead area DA2. The dead area DA2 includes scan drivers SD1 and SD2 located at the outer side of the dummy pixel portion DA1 at opposite sides of the active area AA, and a pad portion 60 provided on one side of the outer periphery of the active area AA, the pad portion 60 having a plurality of pad electrodes. In addition, a circuit board (not illustrated) may be connected to the pad electrodes of the pad portion 60 in the dead area DA2.

The scan drivers SD1 and SD2 may be provided in a built-in form to have a plurality of thin-film transistors for each line, in the same process as that for forming thin-film transistors in the active area AA. However, the backplane substrate of the present disclosure is not limited thereto, and in addition to the built-in-type scan drivers SD1 and SD2, a separate scan driver may be provided in a chip-on-film form.

In the backplane substrate 1000, a folding axis thereof is defined in a given direction. The folding axis corresponds to a bending location of the flexible display.

The backplane substrate of the present disclosure is changed in the structure of the dummy pixel DP and/or the sub-pixel SP so as to prevent peeling at the region at which an organic layer material and an inorganic layer material meet each other in a display device that undergoes repeated folding, and includes a adhesion recess in an inorganic layer at the interface of the inorganic layer with an organic layer.

FIG. 2 is a circuit diagram of the sub-pixel in the active area AA according to an example. Each sub-pixel of the active area AA includes a circuit unit including at least one or more thin-film transistors S-Tr and D-Tr, a storage capacitor Cst, and an organic light-emitting diode OLED connected to the storage capacitor Cst and the thin-film transistor D-Tr.

FIG. 2 illustrates an example in which two thin-film transistors including a selection thin-film transistor S-Tr and a driving thin-film transistor D-Tr are provided, and any other thin-film transistor may be added as needed. Among these, the driving thin-film transistor D-Tr is electrically connected to a first electrode of the organic light-emitting diode OLED, and the storage capacitor Cst is connected between a gate electrode of the driving thin-film transistor D-Tr and a connection end at which the driving thin-film transistor D-Tr is connected to the first electrode of the organic light-emitting diode OLED. The connection end may be a source electrode or a drain electrode of the driving thin-film transistor D-Tr. When the connection end is the drain electrode, the source electrode is connected to a driving current line VDL and receives a driving voltage. When the connection end is the source electrode, the drain electrode is connected to the driving current line VDL.

In addition, the circuit unit is provided between a gate line GL and a data line DL, which are located at the boundary of the sub-pixel and cross each other. The driving current line VDL is parallel to the data line DL and is spaced apart from the data line DL of a neighboring sub-pixel. The selection thin-film transistor S-Tr is provided between the gate line GL and the data line DL and is connected to the gate electrode of the driving thin-film transistor D-Tr, which is connected to the storage capacitor Cst, so that a predetermined sub-pixel transfers current to the organic light-emitting diode OLED via the driving thin-film transistor D-Tr according to the selective driving of the selection thin-film transistor S-Tr, thereby performing on/off control of the organic light-emitting diode OLED.

In addition, a thin-film transistor of a gate circuit block is formed in a shape the same as or similar to that of the selection thin-film transistor or the driving thin-film transistor.

Hereinafter, the principle whereby the interface characteristics of organic and inorganic layers of the present disclosure are improved will be described with reference to the accompanying drawings.

Figure 3A:
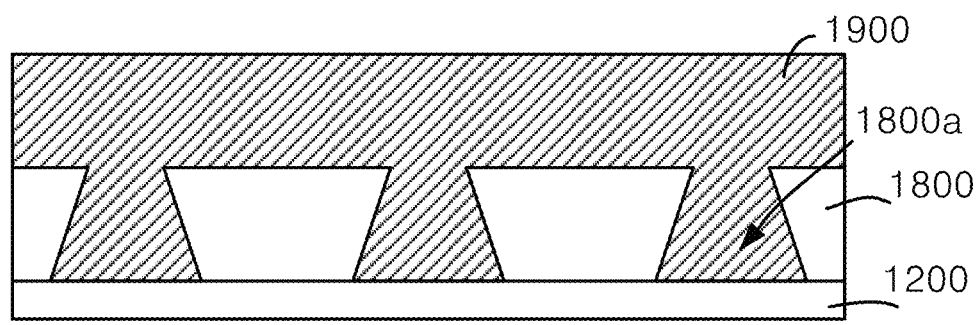
FIGS. 3A and 3B are a schematic cross-sectional view and a schematic plan view of the backplane substrate according to the present disclosure.
Figures 3B, 4:
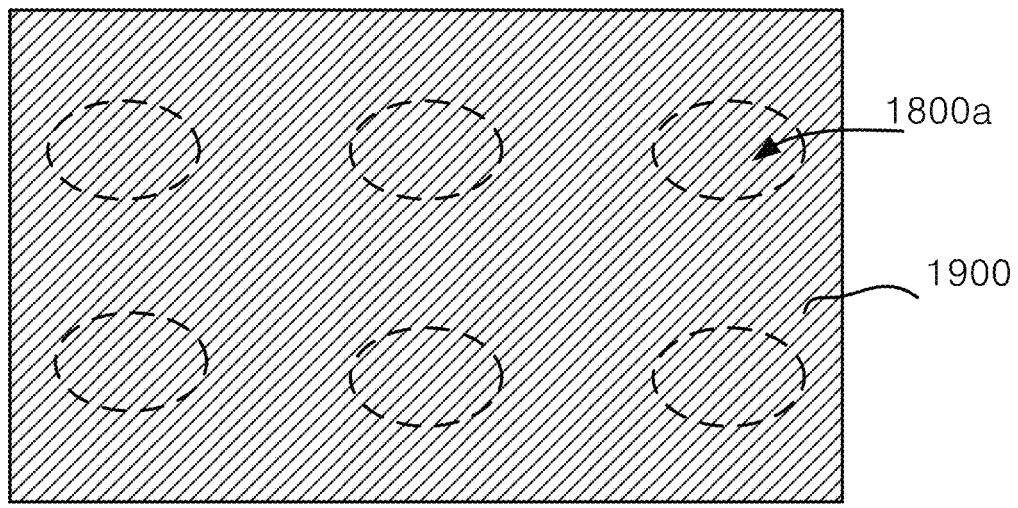
FIG. 4 is a process flowchart illustrating a method of manufacturing the backplane substrate according to the present disclosure.

FIGS. 3A and 3B are a schematic cross-sectional view and a schematic plan view of the backplane substrate according to the present disclosure.

As illustrated in FIGS. 3A and 3B, the backplane substrate according to the present disclosure includes, provided on the flexible base substrate 100 in which the active area AA having the plurality of sub-pixels SP is defined in the center and the dummy pixel portion DA1 having the dummy pixels DP is defined along the edge of the active area AA as illustrated in FIG. 1, an organic layer 1900, which covers both the dummy pixels DP and the sub-pixels SP, and an inorganic layer stack 1800, which is in contact with the bottom of the organic layer 1900 over at least the dummy pixels DP and has a plurality of adhesion recesses 1800a, into which a portion of the organic layer 1900 is formed.

The adhesion recesses 1800a in the inorganic layer stack 1800 have a diameter greater at the lower side thereof than at the top thereof. As such, when the organic layer 1900 is applied onto the inorganic layer stack 1800 having the adhesion recesses 1800a therein, the organic layer 1900 is introduced into each adhesion recess 1800a. The organic layer, when formed, is conformal to the material on which it is formed, therefore, upon formation, portions of the organic layer are introduced into the each recess 1800a to cause the organic layer 1900 to be within each recess. Accordingly, once the organic layer 1900 has been brought into contact with the lateral side and the bottom of the adhesion recess 1800a, even if the strength of the adhesion bond of the organic layer 1900 with the material of the stack 1800 is reduced, the adhesion holding force of layer 1900 within the recess 1800a is not degraded. For for example, if external force applied thereto upon inward folding or outward folding, the organic layer 1900, which has been cured in the adhesion recess 1800a, remains coupled to layer 1800, rather than being peeled off upward, owing to the structure of the adhesion recess 1800a having the narrow upper side and the wide lower side. In this way, peeling off of the organic layer 1900 from the inorganic layer stack 1800 is prevented.

Meanwhile, reference numeral 1200 designates another inorganic layer disposed under the inorganic layer stack 1800, and is an inorganic buffer layer having a buffer function on the base substrate 100.

In one embodiment, the inorganic layer stack 1800 may include, for example, metals of two or more different layers and may attain an inversely tapered structure, in which the upper side has a greater diameter than the lower side, using a difference in etch selectivity. In this case, the inorganic buffer layer 1200 may protect, for example, the base substrate 100 thereunder in a metal removal process. In one embodiment, all layers and sublayers of the inorganic stack 1800 are comprised of inorganic materials, but in a second embodiment, the inorganic stack 1800 may include one or more layers or sublayers of organic material that are included within the stack. Namely, it is not required in the second embodiment that each sub-layer within stack 1800 be composed solely of inorganic material. Meanwhile, the inorganic layer stack 1800 has the plurality of adhesion recesses 1800a therein, and one or more adhesion recesses 1800a may be provided for every dummy pixel DP.

Hereinafter, an example of forming the adhesion recesses 1800a in the backplane substrate of the present disclosure will be described with reference to the manufacturing method.

Figure 5:
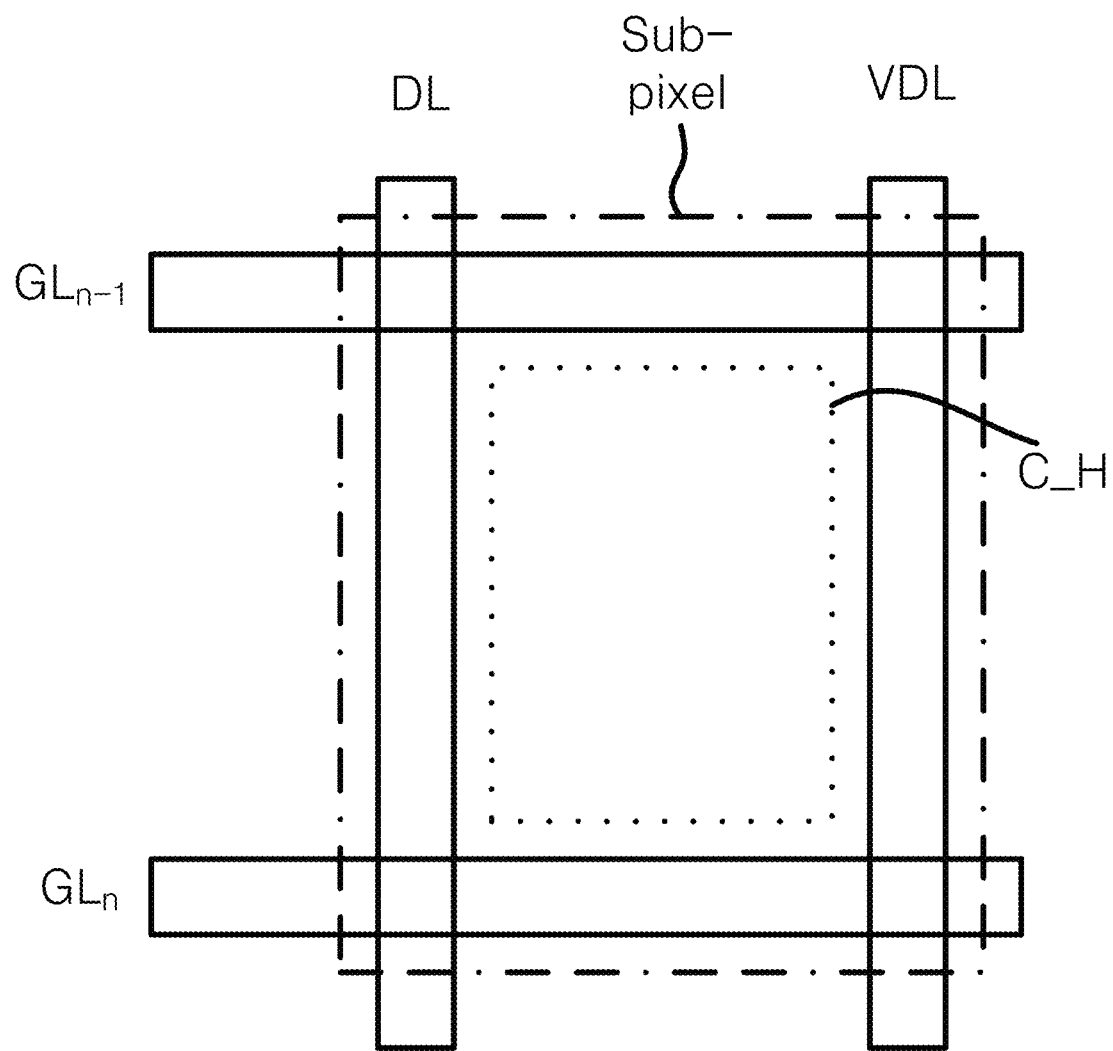
FIG. 5 is a plan view illustrating a dummy pixel of the backplane substrate according to the present disclosure.
Figure 7A:
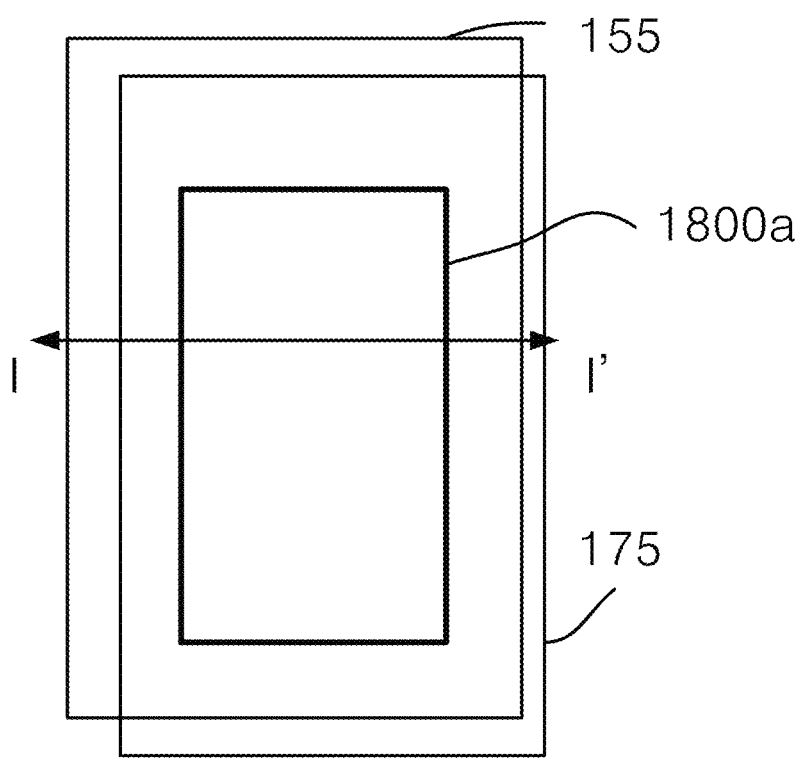
Figure 8:
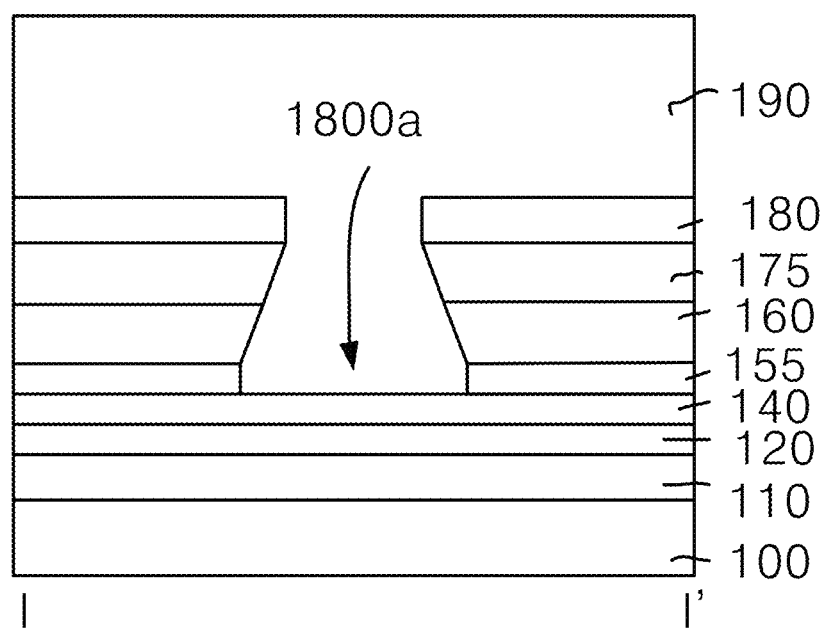
FIG. 8 is a cross-sectional view taken along line I-I' of FIG. 7A.
Figure 9:
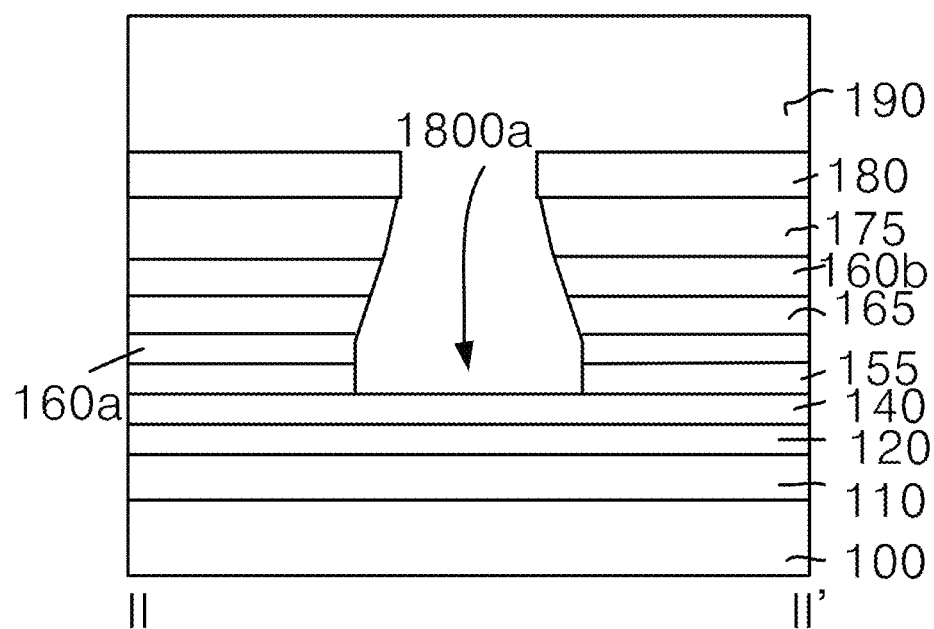
FIG. 9 is a cross-sectional view taken along line II-II' of FIG. 7B.

FIG. 4 is a process flowchart illustrating a method of manufacturing the backplane substrate according to the present disclosure. In addition, FIG. 5 is a plan view illustrating the dummy pixel of the backplane substrate according to the present disclosure, and FIG. 6 is a plan view illustrating the sub-pixel of the backplane substrate according to the present disclosure. In addition, FIGS. 7A and 7B are plan views illustrating several embodiments of the adhesion recesses in the dummy pixel of the backplane substrate according to the present disclosure, FIG. 8 is a cross-sectional view taken along line I-I' of FIG. 7A, and FIG. 9 is a cross-sectional view taken along line II-II' of FIG. 7B.

The method of manufacturing the backplane substrate of the present disclosure is performed in the following sequence.

First, after a sacrificial layer (not illustrated) is formed on a glass substrate (not illustrated), the flexible base substrate 100 is formed on the sacrificial layer.

The flexible base substrate 100, which, in the final assembly, constitutes the backplane substrate 1000 of FIG. 1, is a flexible plastic film, which may include one or more polymer compounds selected from among the group consisting of polyester or a copolymer including polyester, polyimide or a copolymer including polyimide, an olefin-based copolymer, polyacrylic acid or a copolymer including polyacrylic acid, polystyrene or a copolymer including polystyrene, polysulfate or a copolymer including polysulfate, polycarbonate or a copolymer including polycarbonate, polyamic acid or a copolymer including polyamic acid, polyamine or a copolymer including polyamine, polyvinylalcohol, and polyallylamine. Here, the thickness of the flexible base substrate 100 ranges from 5 μm to 150 μm. The thickness of the flexible base substrate 100 may be 50 μm or less.

In the following description related to the formation of respective components, the respective components are assumed as being formed on the entire flexible base substrate 100 and the formation area thereof is not limited to the active area AA or the dead area DA2 including the dummy pixels DP unless specifically stated otherwise.

As illustrated in FIGS. 8 and 9, an inorganic buffer layer 110, which is in the form of a plurality of layers, and an active buffer layer 120 are sequentially formed on the base substrate 100. The inorganic buffer layer 110, which is in the form of a plurality of layers, is provided to protect a thin-film transistor array and an organic light-emitting array in the subsequent process of removing the glass substrate (not illustrated) under the base substrate 100.

Subsequently, after an amorphous silicon layer is deposited on the active buffer layer 120 and is then crystallized into polysilicon using a laser, the polysilicon is selectively removed to form an active layer 130 (110S). The active buffer layer 120 may prevent foreign substances of, for example, the glass substrate (not illustrated) from having an effect on the active layer 130 upon deposition or laser crystallization in the process of forming the active layer 130 (see FIG. 11), and may protect the active layer 130.

In one embodiment, the active layer 130 (see FIG. 11) may be provided to only in those locations that correspond to the sub-pixels SP, and in some cases, may be provided in the locations of the dummy pixels DP as well as the sub-pixels SP. In this embodiment, the active layer 130 is not present adjacent to the recess 1800a, as can be seen in FIGS. 8 and 9.

Subsequently, a gate insulation layer 140 is formed on the active buffer layer 120 and the active layer 130.

Subsequently, a first metal is deposited on the gate insulation layer 140 and is selectively removed to form a plurality of first wires 155 in a line direction (see reference character GL in FIG. 2)(120S). A gate electrode (not shown in the Drawings) of each of the thin film transistor may be integrally formed in the same layer as the first wires 155 in each sub-pixel SP. The first wires 155 refer to all wires formed in the same line direction, and may be provided to correspond to the sub-pixels SP. In addition, the first wires 155 may be formed across the sub-pixels to extend to the dummy pixels so as to be electrically connected to the scan drivers SD1 and SD2. For example, the first wires 155 may include the gate line GL of FIG. 2. In some cases, when a circuit configuration provided in the sub-pixel has an additional component compared to the basic configuration of FIG. 2, the first wires 155 may further include, for example, a scan line SL, in addition to the gate line GL. A first storage electrode 155a of the storage capacitor may be formed in the same layer as the first wires 155 using the same metal.

Subsequently, an interlayer insulation stack 160, which includes a plurality of interlayer insulation layers 160a and 160b, is formed on the gate insulation layer 140 on which the first wires 155 have been formed. Specifically, when forming the interlayer insulation stack 160, after a first interlayer insulation layer 160a is formed, an auxiliary storage electrode 165 is formed, and subsequently, a second interlayer insulation layer 160b is formed. Thereby, an electrode component, which functions as an electrode of the storage capacitor, may be provided between interlayer insulation layers.

Subsequently, the interlayer insulation stack 160 and the gate insulation layer 140 are selectively removed to form contact holes CT, which expose a portion of the active layer 130 (130S).

Subsequently, a second metal is deposited on the interlayer insulation stack 160 having the contact holes CT therein and is then selectively removed to form second wires 175 and 170 in a direction crossing the first wires 155 (140S). A source electrode/a drain electrode 175b (not shown in the Drawings) of each of the thin film transistor may be integrally formed in the same layer as the second wires 175 in each sub-pixel SP. Here, a portion of the second wires is connected to some of the contact holes. The second wires 170 may include the data line DL and the driving current line VDL of the circuit of the sub-pixel illustrated in FIG. 2. The second wires 175 may include a dummy data line DL and a dummy driving current line VDL of the dummy pixel.

Alternatively, when an additional thin-film transistor or an additional capacitor is provided, compared to the circuit of FIG. 2, the second wires 175 and 170 may further include an additional wire such as, for example, a reference voltage line RL, in addition to the data line DL and the driving current line VDL. In addition, in some cases, a second storage electrode 175a, which constitutes the storage capacitor, may be formed in the same layer as the second wires 175 and 170 in the same process.

Meanwhile, the configuration from the active layer 130 to the second wires 175 is referred to as a thin-film transistor array.

Subsequently, an inorganic passivation layer 180 is deposited on the second wires 175 and is then selectively removed to form first pixel contact holes (not illustrated) (150S). Here, when forming the first pixel contact holes, the adhesion recesses 1800a are formed in the dummy pixel regions. Here, the material that is removed from the adhesion recesses 1800a corresponds to a protective layer 180, the second wires 175, the second interlayer insulation layer 160b, the auxiliary storage electrode 165, the first interlayer insulation layer 160a, and the first wires 155. This combined stack of layers corresponds to the layer 1800 of FIG. 3A. In one embodiment, the same etch steps and using the same mask that form the first pixel contact holes, the adhesion recesses 1800a are formed. The use of the same mask and process steps to simultaneously form an electrical contact to the pixels and to form the adhesion recesses 1800a saves time and the number of masks that are required.

As just described, the inorganic stack 1800 is comprised of a stack of layers and sublayers. In one embodiment, each of these layers is made of inorganic material. In a second embodiment, one or more of the layers could include an organic material. For example, layers 160 and 180 are preferably inorganic, but it is also permitted to include one or more organic components in layers 160 or 180 and still consider the stack 1800 to be an inorganic stack. Thus, the meaning of the term inorganic layer when referring to the multilayer stack 1800 permits one or more of the sublayers to include organic material in some embodiments.

In this case, the reason the adhesion recess 1800a has an inversely tapered shape is because the second wires 175 have lower selectivity of an etchant or dry gas than the first wires 155 or the auxiliary storage electrode 165, and therefore, the first wires 155 or the auxiliary storage electrode 155 having higher selectivity thereunder is etched to a greater diameter than the second wires 175.

Subsequently, an organic planarization layer 190 is applied onto the protective layer 180 having the first pixel contact holes therein and is then selectively removed to form second pixel contact holes (not illustrated), which are connected to the first pixel contact holes (160S). Since both the first and second pixel contact holes (not illustrated) expose a portion of the second wires 175 and 170, in the subsequent process of forming a first electrode 200, the first electrode 200 may be connected to a portion of the second wires 175 and 170, or to the same layer as these wires, through the first and second pixel contact holes.

Subsequently, for example, a third metal or metal oxide layer is deposited on the planarization layer 190 having the second pixel contact holes therein and is selectively removed to form the first electrode 200 (see FIG. 11), which is connected to the second wires 170 and 175 through the first and second pixel contact holes (170S).

Subsequently, a bank 210 (see FIG. 11) is formed in an area of each sub-pixel excluding an emission portion (180S).

Subsequently, an organic light-emitting layer 220 (see FIG. 11) is deposited on the bank 210 (see FIG. 11) and on the first electrode 200 including the emission portion.

Subsequently, a second electrode 230 (see FIG. 11) is formed on the organic light-emitting layer 220 using a fourth metal or metal oxide layer. The first electrode 200, the organic light-emitting layer 220 and the second electrode 230 are referred to as the organic light-emitting diode OLED.

In addition, the configuration from the first electrode 200 to the second electrode 230 is referred to as an organic light-emitting array.

An encapsulation layer 240 (see FIG. 11) is provided on the organic light-emitting array in order to cover at least the sub-pixels SP and to prevent moisture permeation. Although a portion of the encapsulation layer 240 may be provided in the dummy pixels, the encapsulation layer 240 may be selectively provided in the dummy pixel portion because the dummy pixels have no layer that is vulnerable to moisture permeation, like the organic light-emitting layer.

Here, the configuration from the flexible base substrate 100 to the encapsulation layer 240 described above is referred to as the backplane substrate.

As illustrated in FIG. 5, the dummy pixel may have a contact-hole forming region C_H defined between the wires (i.e. the gate line GL, the data line DL and the driving current line VDL), and may include a single adhesion recess 1800a or a plurality of adhesion recesses 1800a in the contact-hole forming region C_H. Since the dummy pixel has an anti-electrostatic function and is not actually used for illumination, the contact-hole forming region C_H located between the wires has a large available area. Compared to this, the sub-pixel SP in the active area AA needs to have a storage capacitor forming region STR between the wires. The sub-pixel SP may further have a sub-contact hole C_Hsub formed in a portion of the storage capacitor forming region STR, as illustrated in FIG. 6.

Although difference in bonding at the interface of inorganic and organic layers due to, for example, folding may be observed in the entire area, this bonding difference may be the worst in the peripheral area. Therefore, in the backplane substrate of the present disclosure, it may be more effective for the contact holes having an inversely tapered shape to be provided in the dummy pixel and to be additionally provided in the sub-pixel of the active area.

In addition, as illustrated in FIG. 7A or 7B, two or more wires 155 and 175 or 155, 165 and 175 are located so as to overlap each other, and the adhesion recess 1800a is formed to penetrate the wires.

FIGS. 7A and 8 illustrate the shape in which the adhesion recess 1800a is provided in the first and second wires 155 and 175, the interlayer insulation stack 160 between the first and second wires 155 and 175, and the protective layer 180 above the second wire 175. The adhesion recess 1800a is formed by sequentially removing the protective layer 180, the second wire 175, the interlayer insulation layer 160, and the first wire 155, and is defined simultaneously with the formation of the first pixel contact recess in the protective layer 180.

FIGS. 7B and 9 illustrate the shape in which the adhesion recess 1800a is provided in the first wire 155, the auxiliary storage electrode 165 and the second wire 175, which overlap each other, the first and second interlayer insulation layers 160a and 160b therebetween, and the protective layer 180 above the second wire 175. The adhesion recess 1800a is formed by sequentially removing the protective layer 180, the second wire 175, the second interlayer insulation layer 160b, the auxiliary storage electrode 165, the first interlayer insulation layer 160a and the first wire 155, and is defined simultaneously with the formation of the first pixel contact recess in the protective layer 180.

Hereinafter, a flexible display using the above-described backplane substrate will be described.

*Flexible Display*

Figure 10:
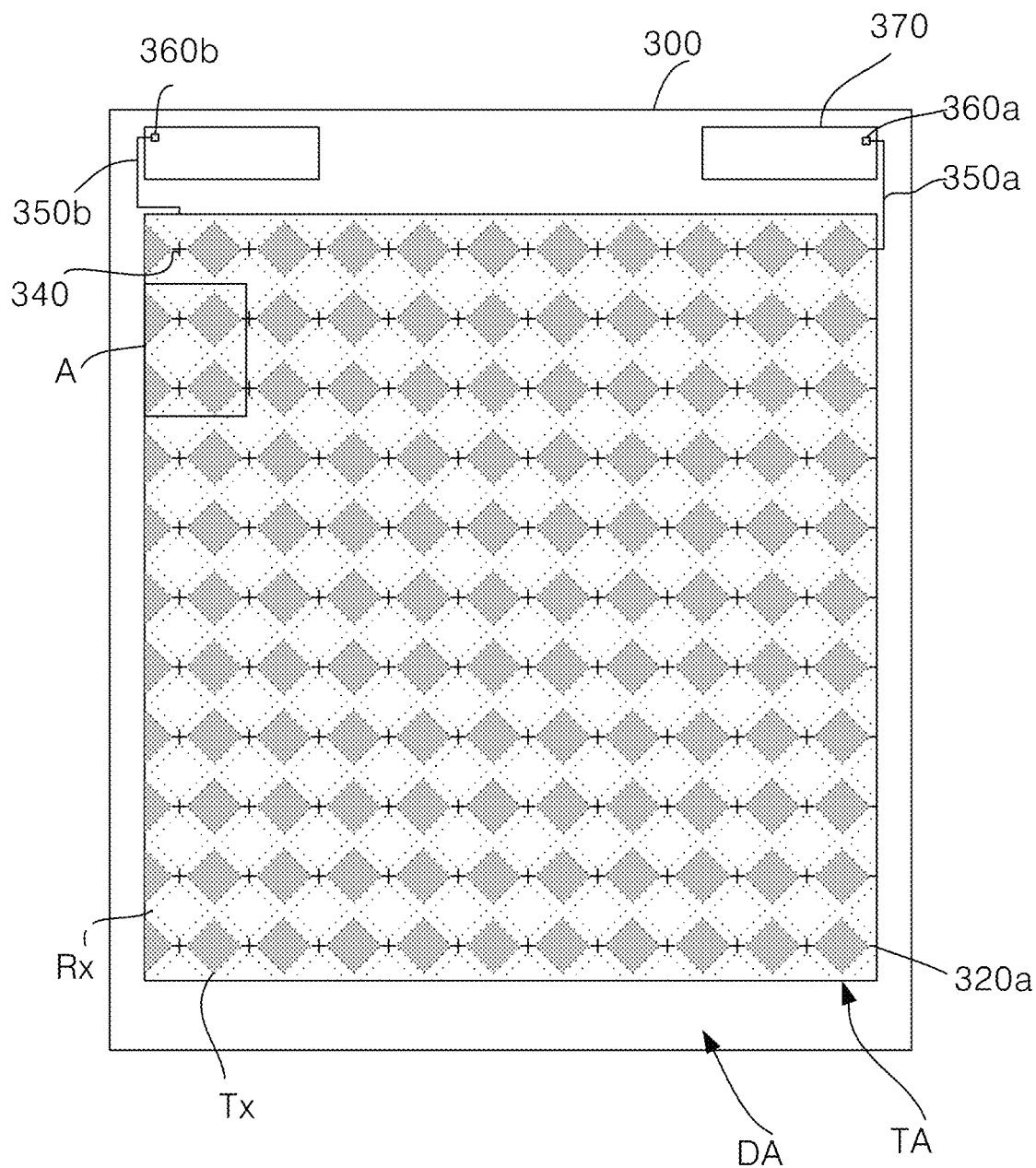
FIG. 10 is a plan view illustrating a touch substrate of a flexible display according to the present disclosure.
Figure 11:
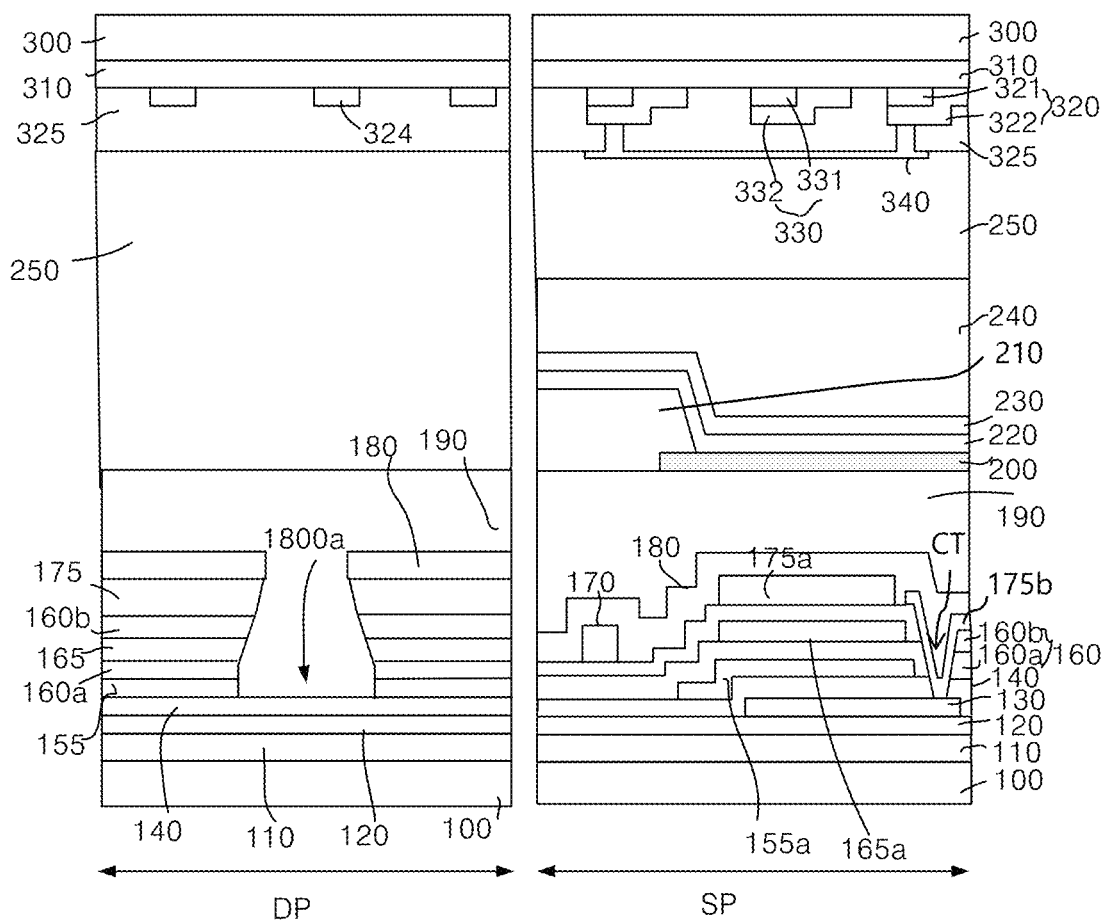
FIG. 11 is a cross-sectional view illustrating the flexible display according to the present disclosure.

FIG. 10 is a plan view illustrating a touch substrate of a flexible display according to the present disclosure, and FIG. 11 is a cross-sectional view illustrating the flexible display according to the present disclosure.

The flexible display of the present disclosure is configured in such a manner that the above-described backplane substrate and a touch substrate are bonded to each other.

As illustrated in FIGS. 10 and 11, the touch substrate includes a plurality of transmission parts Tx 320 and a plurality of transport parts Rx 330, which are disposed on an opposing base substrate 300 in directions crossing each other for touch detection. Here, each transmission part Tx is a block having therein a plurality of first touch wires 321, which are provided in a first direction and a second direction to cross each other. The first touch wires 321 have a lattice shape and are branched about the intersection thereof, rather than being spaced apart from each other, in the same layer. When viewing the planar shape thereof, the first touch wires 321 are shaped such that thin wires form a mesh in the area of the transmission part Tx. Likewise, each transport part Rx includes a plurality of second touch wires 331, which are provided in a third direction and a fourth direction to cross each other in a mesh shape. It will be appreciated that the third direction is the same direction as the first direction and the fourth direction is the same direction as the second direction. However, the disclosure is not limited thereto, and the third direction and the fourth direction of the second touch wires 331 may be set to be different from the first direction and the second direction of the first touch wires 321. In addition, although the first direction and the second direction may be orthogonal to each other as illustrated, the disclosure is not limited thereto, and the angle therebetween may be modified to an acute angle or an obtuse angle.

Although the transmission part Tx and the transport part Rx are illustrated in the drawing as being arranged respectively in the horizontal direction and the vertical direction, the disclosure is not limited thereto. The transmission part Tx and the transport part Rx may be arranged respectively at predetermined angles relative to the horizontal direction, or may be set to be opposite those described above.

The plurality of first touch wires 321 included in the transmission part Tx and the plurality of second touch wires 331 included in the transport part Rx may be formed in the same layer using metal. In this case, in order to prevent electrical short-circuit between the first and second touch wires 321 and 331 at the intersection area of the X-direction in which the transmission parts Tx are arranged and the Y-direction in which the transport parts Rx are arranged, only one of both the touch wires extends to pass through the intersection area and the other one is electrically separated with a bridge electrode 340 of another layer. As illustrated, a connection electrode 320a, which is integrally formed with the first touch wires 321 provided in the transmission part Tx, is provided at the intersection area and is integrally formed with neighboring transmission parts Tx so as to interconnect the neighboring transmission parts Tx. The bridge electrode 340 of another layer is provided to cross the connection electrode 320a and is connected to the second touch wires 331 of neighboring transport parts Rx. Meanwhile, although a single connection electrode 320a may be provided at the intersection area, as illustrated, a plurality of connection electrodes 230a may be spaced apart from one another in the same direction. The respective connection electrodes 320a are connected to the first touch wires 321 of the neighboring transmission parts Tx in the form of blocks.

In another embodiment, when the first touch wires 321 and the second touch wires 331, which respectively constitute the transmission part Tx and the transport part Rx, are metal of different layers, the first touch wires 321 and the second touch wires 331 may respectively extend to the intersection area so as to interconnect neighboring transmission parts Tx and to interconnect neighboring transport parts Rx, even if no bridge electrode of another layer is provided.

The reason why the transmission part Tx and the transport part Rx of the touch substrate include the plurality of first touch wires 321 and second touch wires 331 in the form of a mesh is to increase sensitivity using low-resistance metal without RC delay upon signal transmission and signal detection, to prevent metal wires from being visible in a screen on which an image is displayed by finely dividing the metal wires, and to disperse stress due to folding or bending when used in a flexible organic light-emitting display device.

In addition, the metal, which forms the first touch wires 321 and the second touch wires 331, may be low-resistance metal such as, for example, any one selected from among gold (Au), silver (Ag), palladium (Pd), copper (Cu), aluminum (Al), chrome (Cr), molybdenum (Mo) and titanium (Ti) or a metal stack or a metal alloy including at least one thereof. In one example, the metal stack may be an Ag—Pd—Cu alloy (APC) or a Mo—Al—Mo alloy. However, the metal of the first and second touch wires 321 and 331 is not limited to the above enumerated examples, and may be replaced with another low-resistance metal, or a metal alloy or a metal stack thereof.

Meanwhile, signals are sequentially transmitted to the transmission parts Tx on a per-line basis, and the transport parts Rx perform signal detection on a per-column basis. Here, there is variation in detected signals when a touch occurs, and whether or not a touch occurs is determined by detecting the variation.

The touch substrate of the present disclosure includes a touch electrode array of the first touch wires 321 and the second touch wires 331 described above on the flexible opposing base substrate 300. This touch substrate is bonded to the organic light-emitting array and performs coordinate input and detection functions during driving of an organic display device.

The opposing base substrate 300 may be formed of plastic, thin glass or metal. In addition, a first inorganic buffer layer 310 may be provided on the surface of the opposing base substrate 300 to provide an even film forming surface on which the first and second touch wires 321 and 331 are formed, and to protect a touch electrode array when a sacrificial layer or a glass substrate under the opposing base substrate 300 is removed for flexibility.

Meanwhile, the opposing base substrate 300 includes a center touch area TA having the transmission parts Tx and the transport parts Rx arranged in multiple lines and columns, and an outer peripheral dead area DA. A touch pad portion 370 is provided in a portion of the dead area DA, and routing wires 350a and 350b are provided to extend from the ends of the respective transmission parts Tx and the respective transport parts Rx to the touch pad portion 370. The routing wires 350a and 350b may be in the same layer as the first and second touch wires 321 and 331 described above, or may be in the same layer as the bridge electrode 340.

The dead area DA corresponds to the outside of the touch area TA, and is limited to the partial width of each of four sides of the opposing base substrate 300. A portion of the dead area on the side on which the touch pad portion 370 is located may occupy a relatively wide area.

Although the drawing illustrates an example in which two touch pad portions 370 are provided on the upper side at opposite side positions, the disclosure is not limited thereto, and a single touch pad portion 370 may be centrally provided on the upper side. In addition, the touch pad portions 370 respectively have therein a plurality of touch pads 360a and 360b, and are connected to the routing wires 350a and 350b, which are respectively connected to the transmission parts Tx and the transport parts Rx.

In addition, in the flexible display of the present disclosure, the touch pad portion is connected to a dummy pad portion (not illustrated) of the organic light-emitting array and the thin-film transistor (TFT) array via an anisotropic conductive film when the organic light-emitting array and the touch electrode array are bonded to each other.

Meanwhile, the touch substrate of the present disclosure includes first and second transparent conductive layers 322 and 332 in the form of islands, in order to increase the touch sensitivity of the touch substrate. The first and second transparent conductive layers 322 and 332 are respectively provided at the intersection of the first direction and the second direction and the intersection of the third direction and the fourth direction of the touch wires 321 and 331 in the block-shaped transmission part Tx and transport part Rx. The island-shaped first and second transparent conductive layers 322 and 332 are electrically in contact with the touch wires 321 and 331.

In addition, the first and second transparent conductive layers 322 and 332 are formed of a material such as, for example, indium tin oxide (ITO), indium zinc oxide (IZO) or indium gallium zinc oxide (IGZO).

Although the first and second touch wires 321 and 331 are formed of low-resistance metal and thus have the effect of reducing line resistance and RC delay, the touch wires in the area where a touch actually occurs occupy only a small portion of the touch area, and thus variation in the amount of charge of a touch object is small, which may make it difficult to detect whether or not a touch occurs. The reason why the first and second transparent conductive layers 322 and 332 are provided is to ensure easy detection of variation in capacitance with the touch object (a finger or a pen) by increasing the area of the touch substrate that is occupied by an electrode because the widths of the first and second touch wires 321 and 331 are small. That is, the transparent conductive layer has a length and width greater than the width of the touch wire so as to cover the intersection of the touch wires.

In the flexible display of the present disclosure, the base substrate 100 of the backplane substrate, which includes the thin-film transistor array and the organic light-emitting array, and the opposing base substrate 300, which is opposite the base substrate 100 and includes the touch electrode array, are bonded to each other via an adhesive layer 250.

Other configurations not described with reference to FIG. 5 to 9 will be described below.

The flexible display may include the protective layer 180 and the planarization layer 190, which cover the second wires 175, the organic light-emitting diode OLED, which is provided on the planarization layer 190 so as to correspond to each sub-pixel and includes the first electrode 200, the organic light-emitting layer 220 and the second electrode 230, the encapsulation layer 240, which covers the organic light-emitting diode OLED, the opposing base substrate 300, which is opposite the base substrate 100, the touch electrode array provided on the base substrate 300, and the adhesive layer 250 between the touch electrode array and the encapsulation layer 240. In one embodiment, the adhesion layer 1900 of FIG. 3A corresponds to the layer 190. In a second embodiment, the adhesion layer 1900 corresponds to the combined layers 250 and 190. The adhesion layer 1900 can be comprised of a single layer or a stack of various different layers and sublayers. The adhesion layer 1900 can be comprised of a single layer or a stack of various different layers and sublayers. In one embodiment layer 190 and layer 250 are both organic material. They can be composed of one or more layers and sublayers of organic material. In a further embodiment, the layers 190 and 250 and thus layer 1900 includes one or more layers or sublayers of inorganic material. It is not required for all layers and sublayers of layer 1900 to be organic for the layer 1900 to fall within the definition of organic layer in all embodiments.

The encapsulation layer 240 may have an area greater than that of the planarization layer 190 and may cover the second wires 175 (second dummy wires) and slits 100a of the dummy pixel portion.

Meanwhile, the touch electrode array of the touch substrate may include the touch wires 321 and 331 and the transparent conductive layers 322 and 332, which are provided on the opposing base substrate 300 so as to correspond to the active area AA, and may include the plurality of first and second touch electrodes 320 and 330, which function as the transmission parts and the transport parts and cross each other.

In addition, although the first and second touch electrodes 320 and 330 are respectively the stacks of the metal meshes 321 and 331 and the transparent conductive layers 322 and 332 in the illustrated example, the disclosure is not limited thereto, and the first and second touch electrodes 320 and 330 may have a single layer configuration. The metal mesh may be, for example, an Ag—Pd—Cu (APC) alloy or a Mo—Al—Mo alloy. However, the metal meshes 321 and 331, which constitute the first and second touch electrodes 320 and 330, are not limited to above enumerated examples, and may be replaced with any other low-resistance metal, or a metal alloy or a metal stack thereof.

In addition, the transparent conductive layers 322 and 332 may be formed of a transparent metal oxide layer such as, for example, ITO, IZO, ITZO or IGZO.

Meanwhile, neighboring first touch electrodes 320 are connected to each other via the bridge electrode 340, which is provided in another layer, at the intersection with the second touch electrodes 330. The bridge electrode 340 is connected to the first touch electrodes 320 via a contact recess, which is formed by removing predetermined regions of the first touch electrodes 320, with a touch interlayer insulation layer 325 on the first and second touch electrodes 320 and 330.

Meanwhile, routing wires 324 may be provided in the same layer as the metal meshes so as to correspond to the dummy pixel DP or the dead area.

Meanwhile, the example of FIG. 11 illustrates that the dummy pixel DP includes the adhesion recess 1800a, which is provided in the inorganic interlayer insulation stack including two or more layers of metal (wires) under the organic planarization layer 190, so that the material of the planarization layer 190 is introduced into the adhesion recess 1800a having an inversely tapered shape.

As is apparent from the above description, a backplane substrate and a flexible display using the same according to the present disclosure have the following effects.

First, based on the observed result in which the interface of an organic layer with an inorganic layer inside the display exhibits deterioration in adhesion characteristics upon repeated folding operations, the inorganic layer under the organic layer is provided with a plurality of recesses that formed when the contact holes are formed so that the organic layer is introduced into the corresponding version of the contact holes in the dummy area and dead area, which in these areas become adhesion recesses 1800*a*, which may improve adhesion characteristics of the interface of the inorganic and organic layers.

Second, each adhesion recess 1800*a* has an inversely tapered shape so that the lower side thereof has a greater diameter than the upper side thereof. This may structurally prevent the organic layer from peeling off from the inorganic layer even after repeated folding operations once the organic layer has been introduced into the adhesion recesses in the inorganic layer.

Third, an inorganic layer stack in which the adhesion recesses are formed may include metal wires as well as an inorganic insulation layer, which enables the adhesion recesses to be defined in the inorganic layer stack by the difference in selectivity between a plurality of metal wires in the process of forming the contact holes for the pixels and adhesion recesses at the same time, with the same process steps and etching. Accordingly, formation of the inorganic layer stack having the adhesion recesses may be realized at increased reliability without increasing the number of processes.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Accordingly, various embodiments disclosed in the present disclosure are not intended to limit the technical sprit of the present disclosure, and the scope of the technical sprit of the present disclosure is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A backplane substrate, comprising:
a base substrate having an active area including a plurality of sub-pixels and a dummy pixel portion including a plurality of dummy pixels along an edge of the active area;
an inorganic layer stack at least at the location of the dummy pixels, the inorganic layer stack including:
a plurality of adhesion recesses;
a first wire and a second wire located outside the plurality of adhesion recesses, the first and second wires disposed in different layers of the inorganic layer stack to overlap each other;
a first interlayer insulation layer located between the first and second wires;
a third wire located on an upper side of the second wire so as to overlap the second wire; and
a second interlayer insulation layer between the second wire and the third wire; and
an organic layer in contact with the inorganic layer stack and disposed to overlay the inorganic layer stack at a location of both of the dummy pixels and the plurality of sub-pixels, wherein a portion of the organic layer is inserted in the adhesion recesses.

2. The backplane substrate according to claim 1, wherein the adhesion recess provided in the first wire has a greater diameter than the adhesion recess provided in the second wire and the third wire.

3. The backplane substrate according to claim 1, wherein the second wire and the third wire have a different etch selectivity than the first wire.

4. The backplane substrate according to claim 1 wherein each of the adhesion recesses extends through the first to third wires and the first and second interlayer insulation layer of the inorganic layer stack.

5. The backplane substrate according to claim 1, wherein the organic layer is in contact with the inorganic layer stack at a lateral side and at a bottom of each adhesion recess.

6. The backplane substrate according to claim 1, wherein the adhesion recess provided in the first wire has a greater diameter than the adhesion recess provided in the second wire.

7. The backplane substrate according to claim 6, wherein the first wire has a different etch selectivity than the second wire.

8. The backplane substrate according to claim 1, wherein the inorganic layer stack further includes a plurality of sub-adhesion recesses in the sub-pixels.

9. The backplane substrate according to claim 1, wherein the inorganic layer stack is comprised of a plurality of layers of different materials.

10. The backplane substrate according to claim 9, wherein each layer in the inorganic layer stack is comprised of an inorganic material.

11. The backplane substrate according to claim 9, wherein at least one layer in the inorganic layer stack has an organic material.

12. A flexible display, comprising:
a first flexible base substrate in which an active area having a plurality of sub-pixels is defined in a center thereof and a dummy pixel portion having dummy pixels is defined along an edge of the active area;
a second flexible base substrate configured to be opposite the first flexible base substrate and having a touch wire;

an adhesive layer provided between the first and second flexible base substrates;

an inorganic layer stack at least at the location of the dummy pixels, the inorganic layer stack including:
   a plurality of adhesion recesses;
   a first wire and a second wire located outside the plurality of adhesion recesses, the first and second wires disposed in different layers of the inorganic layer stack to overlap each other;
   a first interlayer insulation layer located between the first and second wires;
   a third wire located on an upper side of the second wire so as to overlap the second wire; and
   a second interlayer insulation layer between the second wire and the third wire; and an organic layer in contact with the inorganic layer stack and disposed to overlay the inorganic layer stack at a location of both of the dummy pixels and the plurality of sub-pixels, wherein a portion of the organic layer is inserted in the adhesion recesses.

13. The flexible display according to claim 12, wherein the inorganic layer stack and the organic layer are sequentially on the first flexible base substrate.

14. The flexible display according to claim 12, wherein the organic layer and the inorganic layer stack are further provided on the second flexible base substrate.

15. The flexible display according to claim 12, wherein the adhesion recesses in the inorganic layer stack have a greater diameter at a lower side thereof than at an upper side thereof.

16. The flexible display according to claim 12, wherein the organic layer is in contact with the inorganic layer stack on a lateral side and a bottom of each adhesion recess.

17. The flexible display according to claim 12, wherein the inorganic layer stack further includes a plurality of sub-adhesion recesses in the sub-pixels.

* * * * *